US006955767B2

(12) United States Patent
Chen

(10) Patent No.: US 6,955,767 B2
(45) Date of Patent: Oct. 18, 2005

(54) SCANNING PROBE BASED LITHOGRAPHIC ALIGNMENT

(75) Inventor: Yong Chen, Redwood City, CA (US)

(73) Assignee: Hewlett-Packard Development Company, LP., Houston, TX (US)

( * ) Notice: Subject to any disclaimer, the term of this patent is extended or adjusted under 35 U.S.C. 154(b) by 577 days.

(21) Appl. No.: 09/815,913

(22) Filed: Mar. 22, 2001

(65) Prior Publication Data

US 2002/0170880 A1 Nov. 21, 2002

(51) Int. Cl.[7] ................................. B44C 1/22
(52) U.S. Cl. .............................. 216/40; 216/44; 216/52
(58) Field of Search ........................... 216/2, 40, 44, 216/52; 264/1.33, 107

(56) References Cited

U.S. PATENT DOCUMENTS

| 5,038,322 A | 8/1991 | Van Loenen |
| 5,317,141 A | 5/1994 | Thomas |
| 5,535,185 A | 7/1996 | Kishi et al. |
| 5,772,905 A | 6/1998 | Chou |
| 5,801,472 A | 9/1998 | Wada et al. |
| 5,866,806 A | * 2/1999 | Samsavar et al. ............ 73/105 |
| 6,136,208 A | 10/2000 | Chou et al. |
| 6,165,911 A | 12/2000 | Calveley |

FOREIGN PATENT DOCUMENTS

| JP | 04342112 | 11/1992 |
| WO | WO02/17383 | 2/2002 |

OTHER PUBLICATIONS

D L White and O R Wood—"Novel Alignment System for Inprint Lithography"—J Vac Sci Technol B 18(6) Nov./Dec. 2000—pp. 3552–3556.
Stephen Y. Chou et al., "Imprint Lithography with 25–Nanometer Resolution," Science, vol. 272 (Apr. 5, 1996).

* cited by examiner

Primary Examiner—Allan Olsen

(57) ABSTRACT

The lithographic process described herein involves aligning a patterned mold with respect to an alignment mark that is disposed on a substrate based upon interaction of a scanning probe with the alignment mark. By this method, the patterned mold may be aligned to an atomic accuracy (e.g., on the order of 10 nm or less), enabling nanometer-scale devices to be fabricated. A device formed by this lithographic method and a system for implementing this lithographic method with alignment also are described.

14 Claims, 7 Drawing Sheets

US 6,955,767 B2

SCANNING PROBE BASED LITHOGRAPHIC ALIGNMENT

TECHNICAL FIELD

This invention relates to systems and methods for scanning probe based lithographic alignment.

BACKGROUND

Many different lithographic methods have been proposed for producing patterns on a surface. For example, optical lithographic techniques commonly are used in the fabrication of integrated circuits. Optical lithography is the process of transferring patterns of geometric shapes from a mask to a thin layer of radiation-sensitive material (e.g., photoresist) covering a surface (e.g., a semiconductor substrate). In general, optical lithography involves depositing a layer of photoresist on a surface, selectively exposing the photoresist to ultraviolet light through a mask, and selectively removing the exposed (or unexposed) photoresist regions. The resulting patterned resist structure may be processed to transfer (e.g., by etching) the pattern to an underlying layer or to transfer (e.g., by a lift-off process) the pattern to an overlying layer deposited over the patterned resist structure. Current optical exposure tools typically are capable of a resolution of approximately 0.1–1 $\mu$m and a registration of approximately 0.5 $\mu$m.

Other lithographic techniques have been developed to improve the resolution and registration limitations of optical lithography. For example, x-ray lithography has a resolution of about 0.5 $\mu$m, or better, and a registration of about 0.5 $\mu$m. Ion beam lithography is capable of a resolution on the order of 10 nm. Imprint lithography is a non-radiation based lithography technique in which surfaces are modified by contact with a master pattern. The master pattern may mold the surface directly or it may initiate chemical reactions on a surface. Imprint lithography may be used to create ultra-fine (sub-25 nm) patterns in a thin film.

Referring to FIGS. 1A–1D, U.S. Pat. No. 5,772,905 describes an imprint lithographic process for creating ultra-fine (sub-25 nm) patterns in a thin film 6 that is disposed on a substrate 8. In accordance with this process, a mold 10 includes a body 12 and a molding layer 14 that includes a plurality of exposed protruding features 16. In operation, mold 10 is pressed into thin film 6 to form a relief pattern (FIG. 1B). In one embodiment, features 16 are not pressed all the way into thin film 6 and, consequently, features 16 do not contact substrate 8. After the mold is removed, thin film 6 has a relief pattern that consists of compressed (or thinned) regions 18 and uncompressed regions 20 (FIG. 1C). Thin film layer 6 may be further processed (e.g., by etching) to expose substrate regions 22 underlying compressed regions 18 of thin film 6 (FIG. 1D). The resulting patterns in thin film 6 may be transferred (e.g., by lift-off processing) to a material that is deposited onto substrate 8. Alternatively, the patterns in thin film 6 may be transferred (e.g., by etching) directly into substrate 8.

As shown in FIG. 2, U.S. Pat. No. 5,772,905 further discloses an alignment system 24 that may be used to align mold 10 with respect to film 6. Alignment system 24 includes a stationary block 26 supporting substrate 8 and a moveable molding block 28 carrying mold 10. A controller 30 controls the operation of an X-Y positioner 32 that is configured to move molding block 28 in a plane parallel to the supporting surface of stationary block 26, and a Z positioner 34 that is configured to move molding block 28 in a direction that is orthogonal to the supporting surface of stationary block 26. An alignment mark 36 is disposed on mold 10 and a complementary mark 38 is disposed on substrate 18. A sensor 40 is carried on moveable molding block 28 and is coupled to alignment marks 36 and 38. Sensor 40 is configured to provide an alignment signal 42 to controller 30. In one embodiment, sensor 40 is an optical detector and alignment marks 36, 38 are configured to generate a moiré alignment pattern that enables moiré alignment techniques to be used to align mold 10 with respect to thin film 6. In another embodiment, alignment marks 36, 38 are formed from electrically conducting material, and sensor 40 is configured to detect the capacitance between alignment marks 36, 38. In this embodiment, mold 10 may be aligned with respect to thin film 6 by moving moveable molding block 28 until the capacitance between alignment marks 36, 38 is maximized.

Still other lithographic techniques have been proposed.

SUMMARY

The invention features a novel lithographic process that involves aligning a patterned mold with respect to an alignment mark that is disposed on a substrate based upon interaction of a scanning probe with the alignment mark. By this method, the patterned mold may be aligned to an atomic accuracy (e.g., on the order of 10 nm or less), enabling nanometer-scale devices (e.g., molecular electronic devices) to be fabricated.

Embodiments in accordance with this aspect of the invention may include one or more of the following features.

The patterned mold may be aligned based upon detection of a tunneling current between the scanning probe and the alignment mark. Alternatively, the patterned mold may be aligned based upon detection of an interaction force generated between the scanning probe and the alignment mark.

The probe preferably is moved near the alignment mark. The probe may be moved near the alignment mark by optical alignment. A voltage may be applied between the probe and the alignment mark to induce a tunneling current between the probe and the alignment mark. The probe preferably has a fixed spatial position relative to the patterned mold. In some embodiments, the probe is carried on the patterned mold.

The aligned mold preferably is urged into a film that is disposed on the substrate to transfer a relief pattern to the film. The thinned regions of the transferred relief pattern may be exposed (e.g., by etching).

In another aspect, the invention features a device formed by the above-described lithographic method.

In another aspect, the invention features a lithographic system that includes a controller that is configured to align a patterned mold with respect to an alignment mark disposed on a substrate based upon interaction of a scanning probe with the alignment mark.

Embodiments in accordance with this aspect of the invention may include one or more of the following features.

The system may include a scanning probe alignment system that is configured to transmit to the controller position reference signals based upon detection of a tunneling current between the scanning probe and the alignment mark or based upon detection of an interaction force generated between the scanning probe and the alignment mark.

The system also preferably includes a scanning system that is configured to move the scanning probe near the alignment mark and an optical alignment system that is configured to cause the scanning system to position the probe near the alignment mark. The scanning system preferably is configured to retract the scanning probe to enable the patterned mold to be urged into a film disposed on the substrate to transfer a relief pattern to the film.

In another aspect, the invention features a lithographic system that includes a mold and a probe. The mold has a patterned surface exposed for contact with a film disposed on a substrate and is configured to be urged into the film to transfer a relief pattern to the film. The probe is configured to interact with a nearby alignment mark that is disposed on the substrate.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1A:
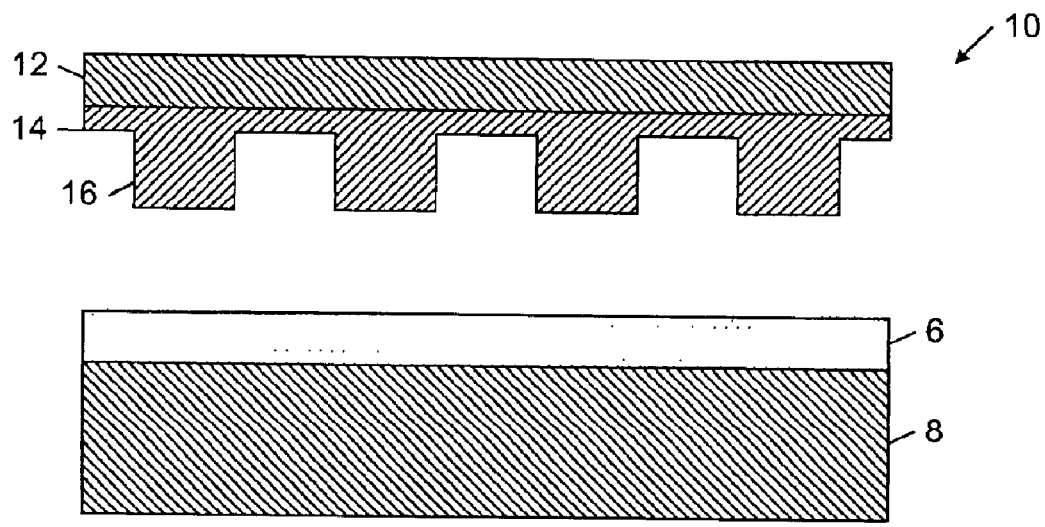
FIG. 1A is a diagrammatic cross-sectional side view of a mold and a moldable thin film disposed on a substrate.
Figure 1B:
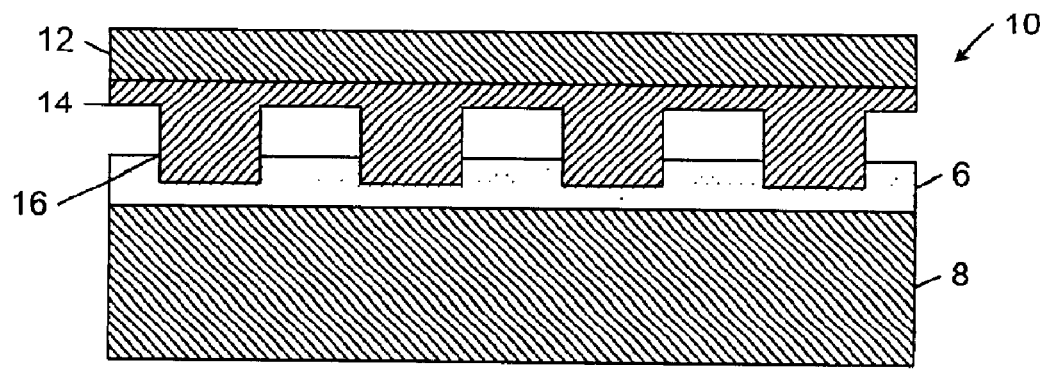
FIG. 1B is a diagrammatic cross-sectional side view of the mold of FIG. 1A pressed into the thin film.
Figure 1C:
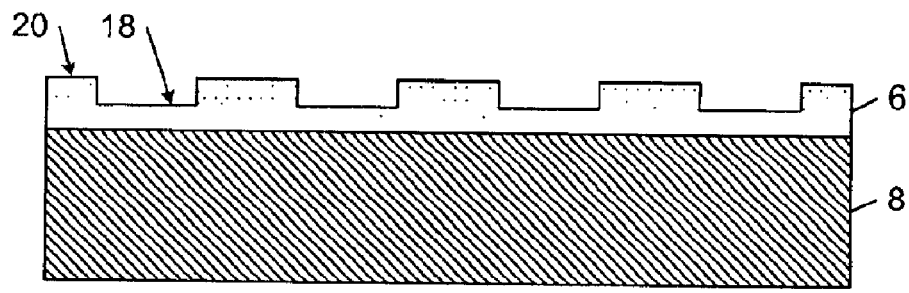
FIG. 1C is a diagrammatic cross-section side view of the thin film of FIG. 1A carrying a relief pattern.
Figure 1D:
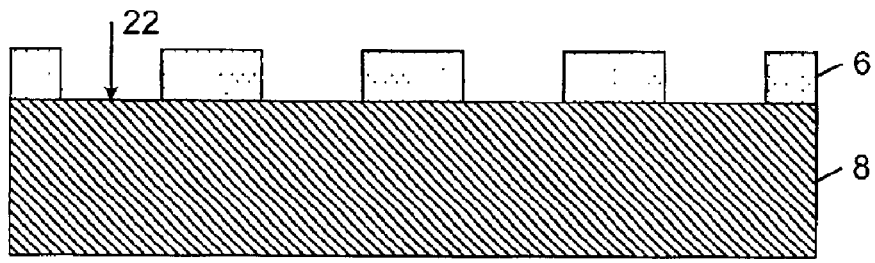
FIG. 1D is a diagrammatic cross-sectional side view of the patterned thin film of FIG. 1C after thinned regions have been removed to expose underlying regions of the substrate.
Figure 2:
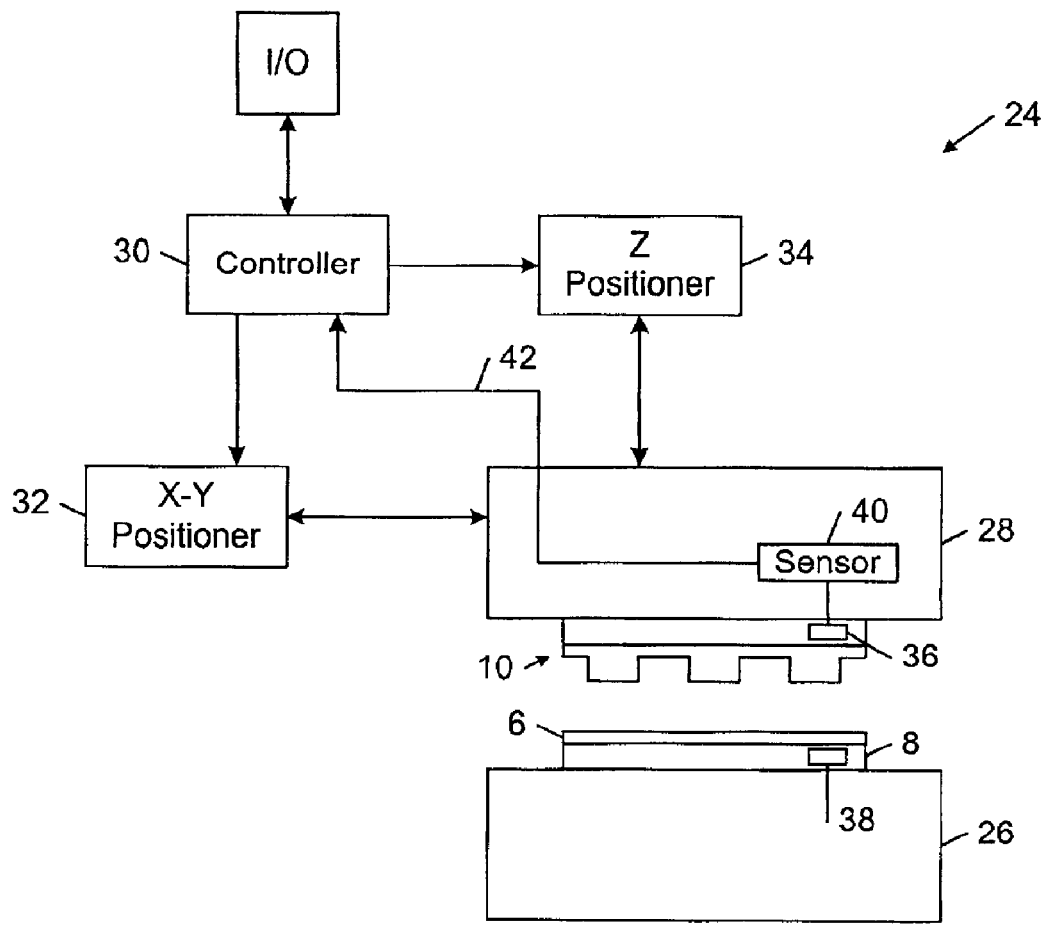
FIG. 2 is a diagrammatic representation of a prior art lithographic system.
Figure 3:
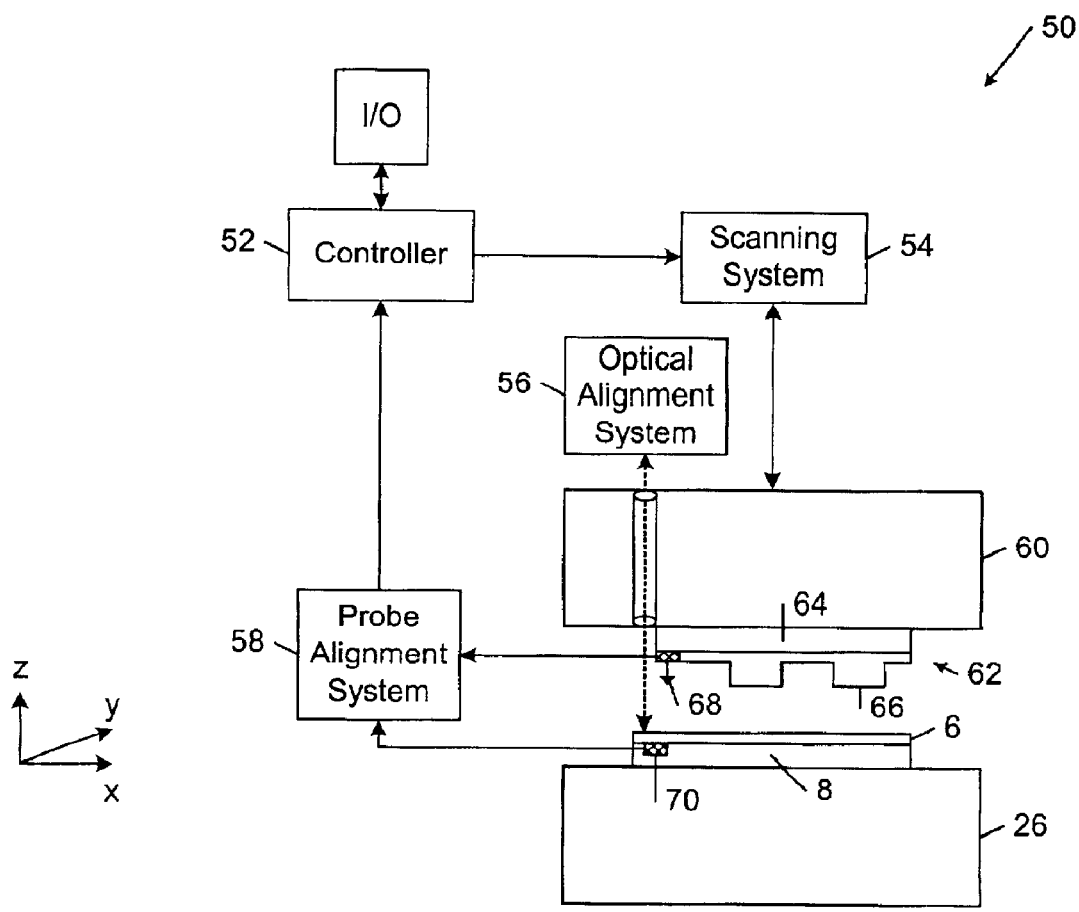
FIG. 3 is a diagrammatic representation of a lithographic system that is configured to align a patterned mold with respect to an alignment mark disposed on a substrate based upon interaction of a scanning probe with the alignment mark.

Referring to FIG. 3, in one embodiment, a lithographic system 50 includes a controller 52, a scanning system 54, an optical alignment system 56, and a scanning probe alignment system 58. Controller 52 is configured to control the operation of scanning system 54 based upon position reference signals that are received from optical alignment system 56 and scanning probe alignment system 58. Controller 52 is not limited to any particular hardware, firmware or software configuration, but rather it may be implemented in any computing or processing environment. For example, controller 52 may be implemented in a high-level procedural or object oriented programming language, or in assembly or machine language; in any case, the programming language may be a compiled or interpreted language.

Scanning system 54 is configured to move a scanning head 60 precisely in a plane (i.e., the x-y plane) that is parallel to the support surface of stationary block 26 and to move scanning head 60 precisely in a direction (i.e., the z-direction) that is orthogonal to the support surface of stationary block 26. Scanning head 60 is configured to carry a mold 62 that includes a mold body 64 supporting a plurality of protruding features 66 and one or more scanning probes 68. In one embodiment, scanning head 60 may be moved vertically by a z-axis scan actuator and may be moved horizontally by a separate x-y axis scan actuator. The z-axis scan actuator and the x-y axis scan actuator both may be carried on scanning head 60. In one embodiment, the z-axis scan actuator and the x-y axis scan actuator may be implemented as planar electrostatic actuators (see, e.g., U.S. Pat. Nos. 6,136,208 and 5,801,472, which are incorporated herein by reference).

Optical alignment system 56 is configured to transmit position reference signals to controller 52 based upon light received from the surface of substrate 8. For example, in one embodiment, optical alignment system 56 may include a sensor that is configured to detect a moiré alignment pattern generated from suitably configured optical alignment marks carried on substrate 8. In this embodiment, conventional moiré alignment techniques may be used to move mold 62 into rough alignment with respect to the one or more optical alignment marks that are carried on substrate 8. Other embodiments may employ different optical techniques (e.g., direct visual observation) to roughly align mold 62 with respect to the one or more optical alignment marks that are carried on substrate 8.

As explained above, mold 62 may be aligned to an atomic accuracy (e.g., on the order of 10 nm or less) based upon position reference signals received from scanning probe alignment system 58. In one embodiment, scanning probe alignment system 58 may be implemented as a conventional scanning tunneling microscope (STM) scanning assembly, in which the positions of probes 68 are controlled based upon tunneling current information. Alternatively, scanning probe alignment system 58 may be implemented as an atomic force microscope (AFM) scanning assembly, in which the positions of probes 68 are controlled based upon a force (e.g., an atomic force, an electrostatic force, or a magnetic force) that is generated between probes 68 and one or more scanning probe alignment marks 70 that are carried on substrate 8.

Referring to FIGS. 4 and 5A–5E, in one embodiment, substrate 8 may be lithographically processed as follows.

Figure 4:
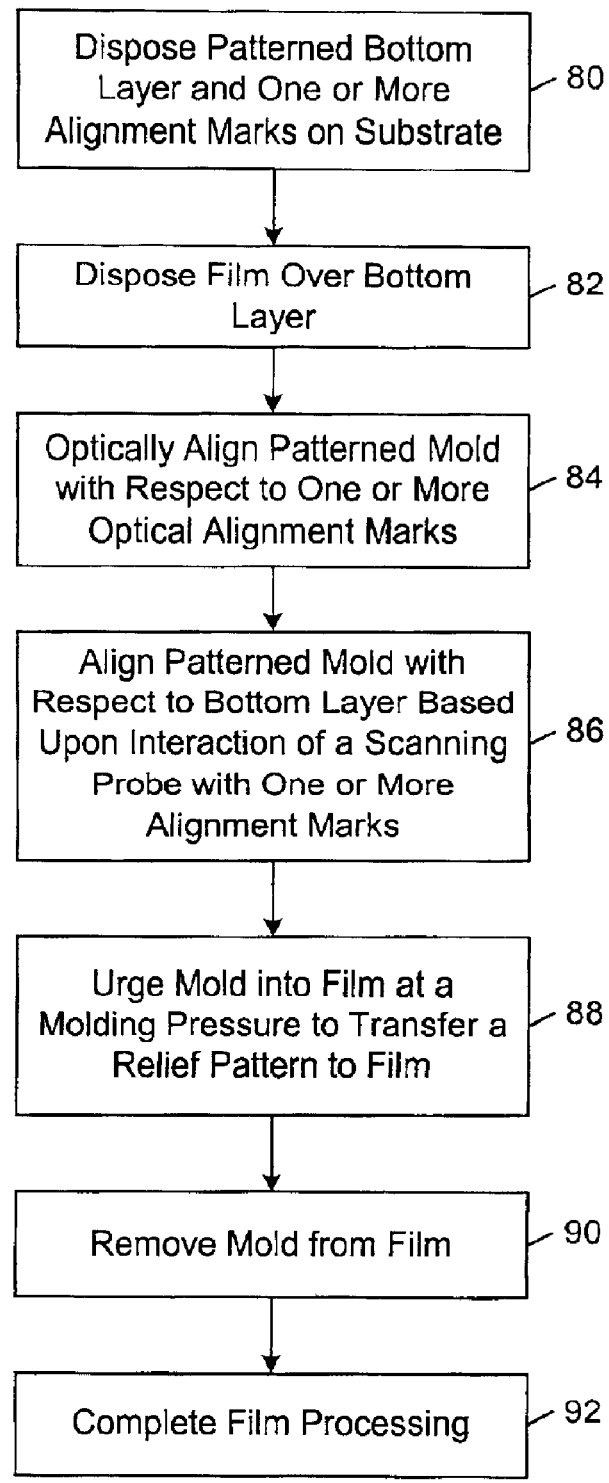
FIG. 4 is a lithographic method of transferring a relief pattern to a film that includes the step of aligning a patterned mold with respect to an alignment mark disposed on a substrate based upon interaction of a scanning probe with the alignment mark.
Figure 5A:
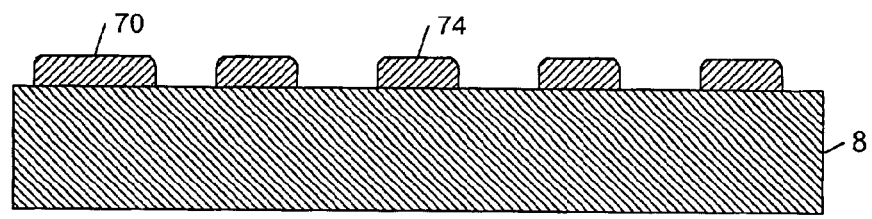
FIG. 5A is a diagrammatic cross-sectional side view of a substrate supporting a patterned bottom layer and an alignment mark.

Referring initially to FIGS. 4 and 5A, a patterned bottom layer 74 and one or more scanning probe alignment marks 70 are disposed on the substrate 8 (step 80). In one embodiment, the bottom layer 74 may be a wire layer consisting of a plurality of electrically conducting wires. The scanning probe alignment marks 70 may be formed from electrically conducting material (e.g., aluminum or titanium) that is patterned to have one or more selected geometric shapes. Scanning probe alignment marks 70 may be coupled to scanning probe alignment system 58 by respective electrically conducting wires.

Figure 5B:
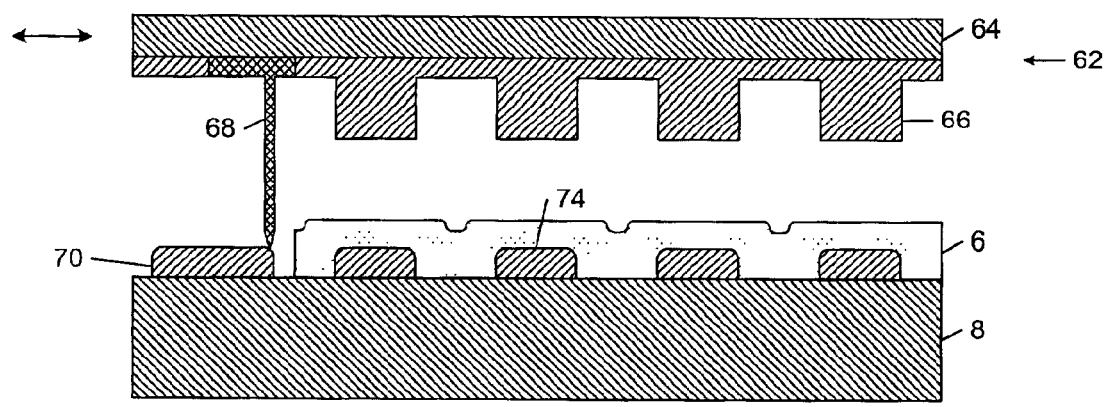
FIG. 5B is a diagrammatic cross-sectional side view of a patterned mold carrying a scanning probe, and the substrate of FIG. 5A with a thin film disposed over the patterned bottom layer and the alignment mark.

Referring to FIG. 5B, a moldable thin film 6 is disposed over the patterned bottom layer 74, but not over the one or more alignment marks 70 (step 82; FIG. 4). In one embodiment, the film 6 includes a thermoplastic polymer (e.g., poly-methyl methacrylate (PMMA)). A patterned mold 62 is aligned optically with respect to the one or more optical alignment marks 76 (step 84; FIG. 4). As mentioned above, in one embodiment, the patterned mold 62 may be aligned optically using a conventional moiré alignment technique. The patterned mold 62 then is aligned based upon interaction of one or more of the scanning probes 68 with one or more of the scanning probe alignment marks 70. As mentioned above, the scanning probe alignment may be based upon detection of a tunneling current between the scanning probes 68 and the alignment marks 70 or detection of a force (e.g., an atomic force, an electrostatic force, or a magnetic force) that is generated between the scanning probes 68 and the alignment marks 70.

Figure 5C:
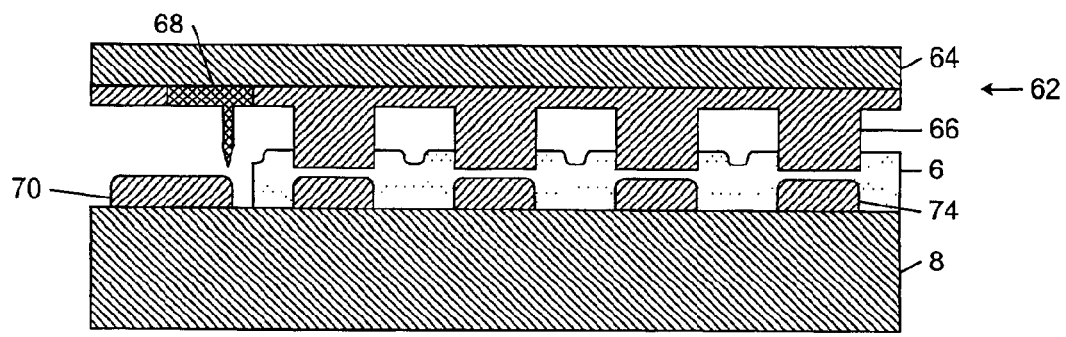
FIG. 5C is a diagrammatic cross-sectional side view of the patterned mold of FIG. 5B pressed into the thin film to transfer a relief pattern to the thin film.

As shown in FIG. 5C, after the patterned mold 62 has been aligned, scanning probes 68 retract and mold 62 is urged into the film 6 at a molding pressure that is sufficient to transfer a relief pattern to the film 6 (step 88; FIG. 4). During this compressive molding step, the film 6 may be heated to a temperature at which the film 6 is sufficiently softened relative to the hardness of the mold 62 so that the film 6 may conform to the protruding features 66 of the mold 62. For example, in one embodiment, the film 6 may be heated to a temperature that is at or above the glass transition temperature of the film 6.

Figure 5D:
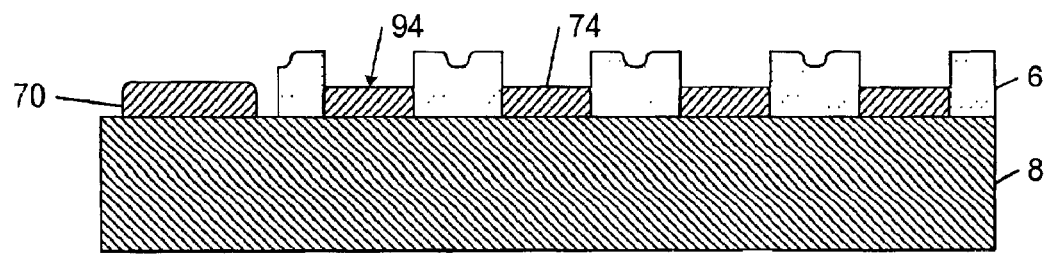
FIG. 5D is a diagrammatic cross-sectional side view of the patterned thin film of FIG. 5C with thinned regions removed to expose underlying regions of the substrate.

Referring to FIG. 5D, after the relief pattern has been transferred to the film 6, the mold 62 is removed from the film 6 (step 90; FIG. 4). The patterned film 6 then may be further processed (step 92; FIG. 4). For example, in one embodiment, thinned regions 18 of the patterned film 6 may be removed (e.g., by etching) to expose underlying regions 94 of the bottom layer (or the substrate).

Figure 5E:
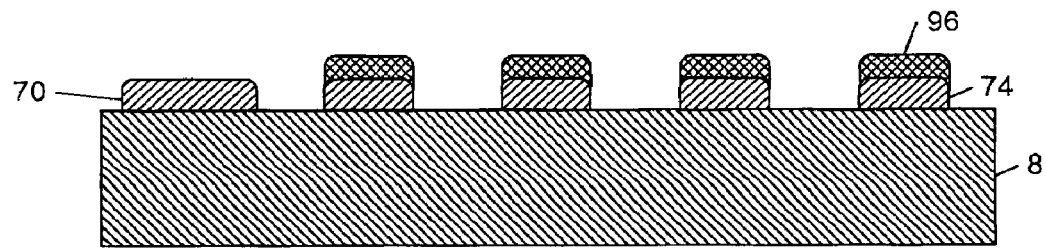
FIG. 5E is a diagrammatic cross-sectional side view of the substrate of FIG. 5A after the thin film pattern of FIG. 5D was transferred to an overlying top layer by a lift-off process.

As shown in FIG. 5E, in one embodiment, the resulting patterns in the film 6 may be transferred (e.g., by lift-off processing) to a material 96 that is subsequently deposited onto substrate 8. In another embodiment, the resulting patterns in the film 6 may be transferred (e.g., by etching) directly into substrate 8.

Figure 6:
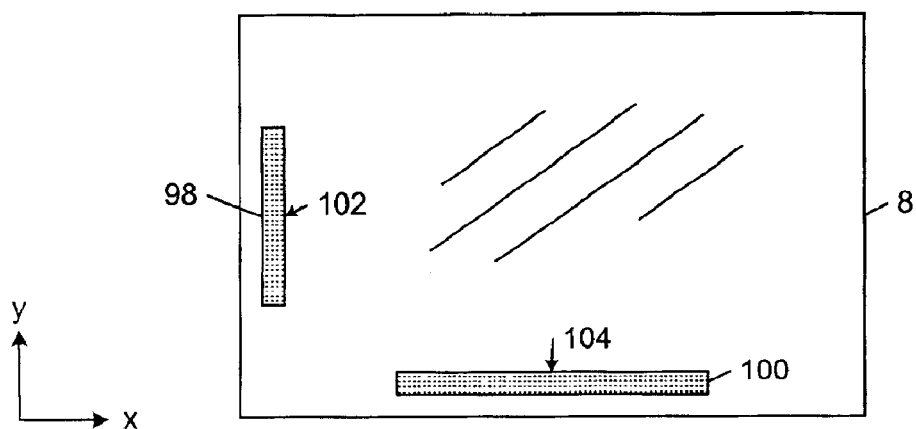
FIG. 6 is a diagrammatic top view of a substrate supporting two alignment marks that are oriented in orthogonal directions.

Referring to FIG. 6, in one embodiment, a pair of orthogonally-oriented alignment marks 98, 100 may be disposed on substrate 8 to enable controller 52 to precisely align mold 62 in the x-y plane, which is parallel to the exposed support surface of stationary block 26. In this embodiment, scanning probe alignment system 58 may align mold 62 in the x-direction by detecting a leading edge 102 of alignment mark 98, and scanning probe alignment system 58 may align mold 62 in the y-direction by detecting a leading edge 104 of alignment mark 100. Mold 62 also may be aligned based upon the detection of edges of alignment marks 98, 100 that are different from edges 102, 104. In addition, other embodiments may include one, or more than two, alignment marks.

The above-described imprinting lithographic process may be used to fabricate a wide variety of different nano-scale devices.

Figure 7:
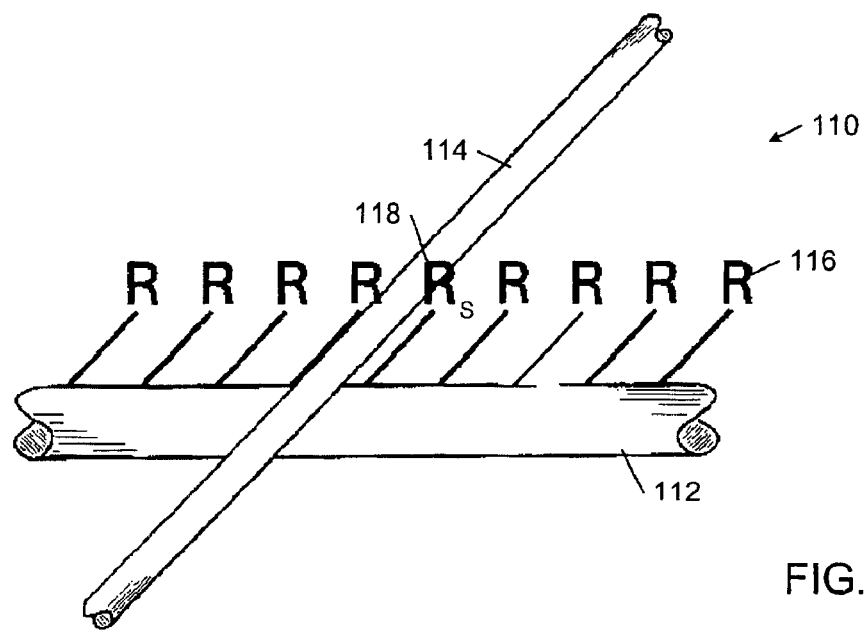
FIG. 7 is a diagrammatic perspective representation of a molecular electronic device formed from at least one electrically addressable molecular species that is sandwiched between two crossed electrically conductive wires.

Referring to FIG. 7, in one embodiment, the above-described lithographic process may be used to fabricate a molecular electronic device 110 that includes two electrically conducting wires 112, 114 that are crossed at a non-zero angle, and a layer of bi-stable molecules or molecular compounds 116 (denoted by the symbol R) that is sandwiched between wires 112, 114. In particular, molecular electronic device 110 may be fabricated as described in U.S. application Ser. No. 09/815,922, filed on Mar. 22, 2001, by Yong Chen, and entitled "Passivation Layer for Molecular Electronic Device Fabrication," or as described in U.S. application Ser. No. 09/815,844, filed on Mar. 21, 2001, by Yong Chen, and entitled "Fabricating A Molecular Electronic Device Having A Protective Barrier Layer," both of which are incorporated herein by reference. However, in this embodiment, electrically conducting wires 112, 114 may be patterned and aligned in accordance with the above-described imprint lithography process.

Each wire 112, 114 may be formed from a metal or a doped semiconductor material. The particular molecule or molecules 18 (denoted by the symbol $R_s$) that are located at the intersection (or junction) of wires 112, 114 act as switch molecules and correspond to the active portion of molecular electronic device 110. In operation, the state of molecular electronic device 110 may be changed by applying a relatively high state-changing voltage across wires 112, 114. The magnitude of the state-changing voltage is sufficient to oxidize or reduce switch molecules 118. Switch molecules 118 may include a redox pair of molecular species that cooperate to balance charge such that when one of the molecular species is oxidized (or reduced), the other molecular species is reduced (or oxidized). In operation, in one example, one molecular species may be reduced and the associated molecular species (the other half of the redox pair) may be oxidized. In another example, one molecular species may be reduced and one of the wires 112, 114 may be oxidized. In a third example, one molecular species may be oxidized and one of the wires 112, 114 may be reduced. In a fourth example, one wire may be oxidized and an oxide associated with the other wire may be reduced. In each of these examples, oxidation or reduction affects the tunneling distance or the tunneling barrier height between the two wires, thereby exponentially altering the rate of charge transport across the wire junction. This electronic functionality serves as the basis for operating molecular electronic device 10 as an electrical switch.

Additional details regarding the general features of molecular electronic device 110 may be obtained from U.S. Pat. No. 6,128,214, which is incorporated herein by reference.

Depending upon the molecules or materials selected for molecular layer 16, molecular electronic device 110 may exhibit any one of a variety of different electrical switching functions that may be used to controllably connect or disconnect bottom wire layer 112 and top wire layer 114. The molecular electronic device may be singly configurable or reconfigurable. In singly configurable embodiments, the initial state of molecular electronic device 110 may be open or closed. By electrically biasing molecular electronic device 110 beyond a particular threshold voltage, the active material or molecules 118 may be oxidized or reduced to permanently reverse the initial state of the device and, thereby, irreversibly close or open the switching state of the device. In reconfigurable embodiments, the switching device may be opened and closed multiple times by cycling the polarity and the magnitude of the applied voltage beyond appropriate threshold values that are selected to reversibly oxidize and reduce the active material or molecules 118.

In general, the type of electrical connection formed between bottom wire layer 112 and top wire layer 114 depends upon the materials from which wire layers 112, 114 and molecular layer 116 are formed. Table 1 identifies the various types of electrical switching functions that may be obtained from different device material combinations.

TABLE 1

| | Wire Layer Materials | | | | |
|---|---|---|---|---|---|
| Device Type | Metal-Metal (same) | Metal-Metal (different) | Metal-Semiconductor | Semiconductor-Semiconductor (pn junction) | Semiconductor-Semiconductor (heterojunction) |
| Resistor | X | X | X | | |
| Tunneling Resistor | X | X | X | | |
| Resonant Tunneling Resistor | X | X | X | | |
| Diode | | X | X | X | X |
| Tunneling Diode | | X | X | X | |
| Resonant Tunneling Diode | | X | X | X | X |
| Battery | | X | X | | X |

Figure 8:
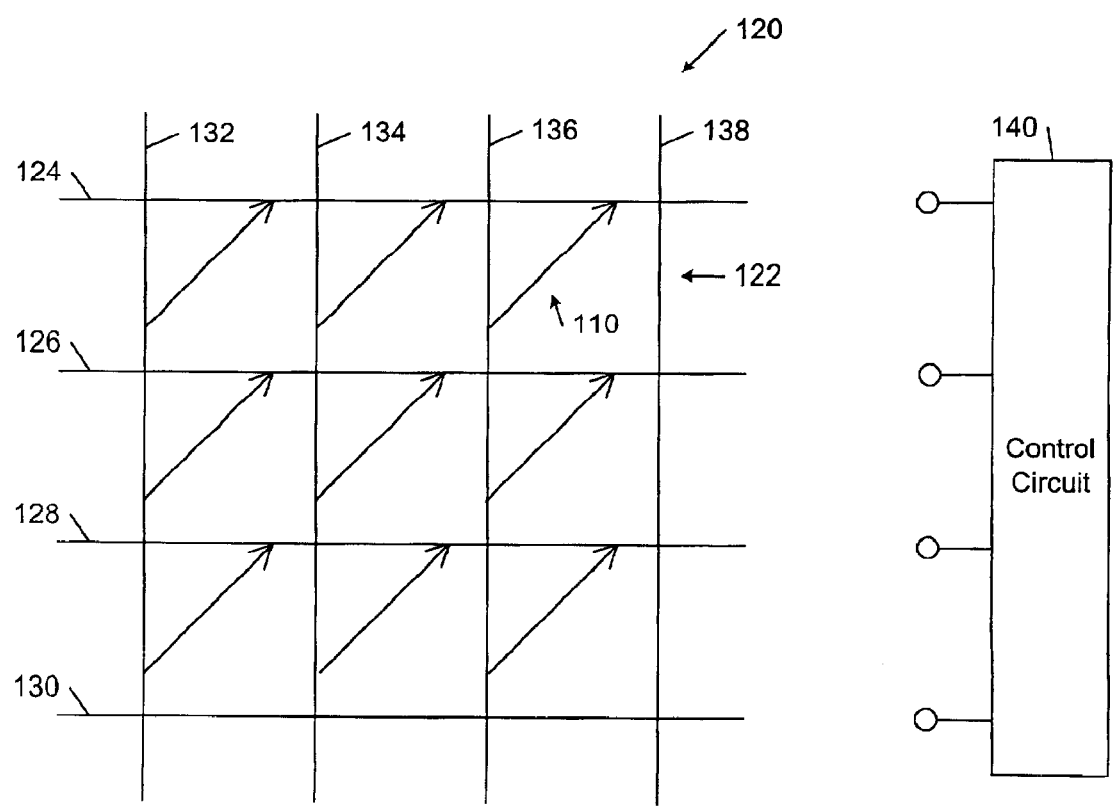
FIG. 8 is a circuit diagram of a resistive crossbar memory structure that includes an array of molecular electronic devices fabricated by an imprint lithographic process.

Referring to FIG. 8, in one embodiment, molecular electronic device 110 may be incorporated into a resistive molecular wire crossbar memory 120 that includes a plurality of memory cells 122 that are arranged in multiple rows and multiple columns. Each memory cell 122 includes a molecular electronic device 110 that is coupled between a respective bottom wire line 124, 126, 128, 130 and a respective top wire line 132, 134, 136, 138. The voltage across a memory cell is determined by the voltages applied to the bottom wire line and the top wire line between which the memory cell is coupled. A control circuit 140 is configured to address (or select), program information into, and read information from one or more memory cells 122 within memory cell array 120. Molecular electronic devices 110 are activated by electrochemical reduction or oxidation of the molecules 118 that are sandwiched between the bottom and top wire lines. In this embodiment, the molecules of molecular layer 116 are selected to have a large hysteresis in the voltammogram so that a switch may be oxidized at a relatively high voltage and its status may be read at a lower voltage. When a switch is (electrochemically) closed, the resistance between connecting wires is low, which may correspond to a logic level of "1". When the switch is opened, the resistance is high, which may correspond to a logic level of "0". Further details regarding the operation of a resistive molecular crossbar memory may be obtained from U.S. Pat. No. 6,128,214.

Other embodiments are within the scope of the claims.

For example, in addition to a resistive molecular wire crossbar memory, other molecular wire crossbar memory embodiments may include an array of molecular electronic devices that are configured to provide any one of the other switching functions identified in Table 1. In addition, the above-described molecular electronic devices may be implemented in a circuit designed to perform one or more logic (as opposed to memory) functions.

Still other embodiments are within the scope of the claims.

What is claimed is:

1. A lithographic method, comprising:

forming a bottom layer and a scanning probe alignment mark on a substrate;

forming a thin film on the bottom layer leaving the scanning probe alignment mark exposed for interaction with a scanning probe;

aligning a patterned mold with respect to the exposed alignment mark based upon interaction of the exposed alignment mark with a scanning probe extended toward the alignment mark; and urging the aligned patterned mold into the thin film.

2. The method of claim 1, wherein the patterned mold is aligned based upon detection of an interaction force generated between the scanning probe and the alignment mark.

3. The method of claim 1, further comprising retracting the extended scanning probe before the aligned patterned mold is urged into the thin film.

4. The method of claim 1, wherein the aligning comprises detecting a tunneling current between the scanning probe and the alignment mark.

5. The method of claim 1, further comprising moving the scanning probe near the alignment mark.

6. The method of claim 5, wherein the moving comprising initially aligning the scanning probe with the alignment mark by optical alignment.

7. The method of claim 5, further comprising applying a voltage between the scanning probe and the alignment mark to induce a tunneling current between the probe and the alignment mark.

8. The method of claim 5, wherein the scanning probe has a fixed spatial position relative to the patterned mold.

9. The method of claim 5, wherein the scanning probe is carried on the patterned mold.

10. The method of claim 1, further comprising:

after urging the aligned pattern mold into the thin film, removing the patterned mold from the thin film, whereby a relief pattern is transferred to the thin film.

11. The method of claim 10, further comprising removing thinned regions of the transferred relief pattern to expose underlying regions of the bottom layer.

12. The method of claim 10, further comprising:

after removing the patterned mold, depositing a material over the substrate and patterning the deposited material by lift-off processing of the thin film.

13. The method of claim 10, further comprising:

after removing the patterned mold, transferring the relief pattern the thin film to the bottom layer.

14. A lithographic method, comprising:

aligning a patterned mold with respect to an alignment mark disposed on a substrate based upon interaction of a scanning probe with the alignment mark, wherein the patterned mold is aligned based upon detection of a tunneling current between the scanning probe and the alignment mark.

* * * * *